United States Patent [19]

Chouan

[11] Patent Number: 5,250,451
[45] Date of Patent: Oct. 5, 1993

[54] PROCESS FOR THE PRODUCTION OF THIN FILM TRANSISTORS

[75] Inventor: Yannick Chouan, Louannec, France

[73] Assignee: France Telecom Etablissement Autonome De Droit Public, France

[21] Appl. No.: 866,342

[22] Filed: Apr. 10, 1992

[30] Foreign Application Priority Data

Apr. 23, 1991 [FR] France .................... 91 04994

[51] Int. Cl.$^5$ ...................... H01L 21/265
[52] U.S. Cl. .................... 437/40; 437/101; 437/913; 148/DIG. 1; 148/DIG. 150; 148/DIG. 100
[58] Field of Search .............. 437/40, 84, 100, 101, 437/913, 229; 148/DIG. 1, DIG. 100, DIG. 150

[56] References Cited

U.S. PATENT DOCUMENTS

| | | | |
|---|---|---|---|
| 4,517,733 | 5/1985 | Hamano | 437/2 |
| 4,808,833 | 2/1989 | Saito | 437/2 |
| 5,079,178 | 1/1992 | Chouan et al. | 437/101 |

FOREIGN PATENT DOCUMENTS

| | | |
|---|---|---|
| 0063917 | 11/1982 | European Pat. Off. |
| 0284218 | 9/1988 | European Pat. Off. |
| 0333208 | 9/1989 | European Pat. Off. |
| 0377365 | 7/1990 | European Pat. Off. |
| 0381111 | 8/1990 | European Pat. Off. |
| 58-119669 | 7/1983 | Japan .................... 437/229 |
| 1-105577 | 4/1989 | Japan .................... 437/911 |
| 2228745 | 9/1990 | United Kingdom . |

OTHER PUBLICATIONS

Journal of Applied Physics, W. J. Vargue, et al. pp. 3835–3841; Apr. 1990; "Electrical and chemical characteristics of a-C:H prepared by rf glow discharge".

Thin Solid Films, Z Has, et al., (1986) No. 2, pp. 161–166, "Electrical properties of thin carbon films obtained by R.F. methane decomposition on an R.F. powered negatively self biased electrode".

*Primary Examiner*—Brian E. Hearn
*Assistant Examiner*—Michael Trinh
*Attorney, Agent, or Firm*—Pearne, Gordon, McCoy & Granger

[57] ABSTRACT

Process for the local passivation of a substrate by a hydrogenated amorphous carbon layer and process for producing thin film transistors on said passivated substrate. The local passivation process consists of producing photosensitive resin patterns (3) on the substrate (1), subjecting the structure obtained to a radio-frequency plasma essentially constituted by a hydrocarbon for thus depositing a hydrogenated amorphous carbon layer (6) on the structure and dissolving the resin patterns (3) in order to eliminate the amorphous carbon deposited on the resin, the amorphous carbon deposited on the substrate constituting the said passivation.

11 Claims, 2 Drawing Sheets

PROCESS FOR THE PRODUCTION OF THIN FILM TRANSISTORS

FIELD OF THE INVENTION

The present invention relates to a process for the local passivation of a substrate by a thin amorphous hydrogenated carbon layer or film. It is used in microelectronics and in particular in producing control circuits for flat-face liquid crystal screens.

The invention more specifically makes it possible to produce thin film transistors based on hydrogenated amorphous silicons used in active matrix display screens. The invention also makes it possible to produce a thin film transistor having a "planar" structure in a so-called "stacked with gate on top" configuration like that used in active matrixes for flat-faced liquid crystal screens. In general terms, the invention relates to a process for the local passivation of a substrate by a thin amorphous hydrogenated carbon film.

BACKGROUND OF THE INVENTION

It is known to deposit thin amorphous hydrogenated carbon films, designated a-C:H, or of a polycrystalline nature on glass or silicon substrates using plasma-assisted chemical vapour phase deposition (PECVD). The gas used for carbon deposition is essentially a mixture of methane and hydrogen. In this connection reference is made to the following articles:

"Electrical and chemical characterization of a-C:H prepared by RF glow discharge", W. J. Varhue et al—J. Appl. Phys. 67(88)—15 Apr. 1990, pp 3835–3841;

"Diamond and diamond-like films: Deposition processes and properties", C. V. Deshpandey et al, J. Vac. Sci. Technol. A7(3), May/June 1989, pp 2294–2302.

As a result of its mechanical characteristics, amorphous hydrogenated carbon, designated a-C:H, is at present mainly used as a protection material (optical components, tools, etc.), but its electrical properties also make it possible to consider its used as a dielectric.

The aforementioned document by Warhue teaches (FIGS. 2 and 11) the obtaining of a-C:H films with high resistivities ($10^{12}$ to $13^{13}$ ohms.cm) by using very low gas pressures of $\leq 4$ Pa (30 mTorrs) and radio-frequency power levels of 10 W. Under these experimental conditions, the a-C:H films are highly stressed and adhere badly to the substrate. There is a risk of the separation of 150 to 200 nm films.

The production of an active matrix for a flat-faced liquid crystal screen having two masking levels, as described in French patent FR-A-2 533 072, makes it necessary to etch a thin metal oxide film supported by a glass substrate in order to reveal the columns of the matrix. This oxide is indium-tin oxide (ITO). This metal oxide etching takes place by the wet route using a solution containing hydrochloric acid and iron perchloride.

The wet route etching speeds are generally considered as very short distance isotropic. However, on large substrates ($>1$ dm$^2$), there is a gradient of the etching speed between the peripheral zones and the centre of the substrate. The highest etching speeds are observed on the edges of the substrate. As a result of this phenomenon, in order to obtain a complete etching of the thin metal oxide film, it is necessary to overexpose the peripheral zones to the etching bath.

There can then be a partial etching of the glass and the diffusion of chlorine ions into its volume. Therefore there is a deterioration in the quality of the thus exposed glass surface.

The thin film transistors used in flat-faced screens use as the semiconductor material amorphous hydrogenated silicon, designated a-Si:H. The structure of these transistors leads to the deposition of said silicon directly on the glass. There is then a migration of the chlorine ions diffused in the glass. This chlorine ion migration and the quality of the amorphous silicon-glass interface modify the semiconducting properties of the silicon, leading to a deterioration of the electrical properties and a limited life for the said transistors.

The first problem which the present invention seeks to solve is the reproducible control of the quality of the amorphous silicon-glass interface by proposing a process for the local passivation of the glass substrate. This problem has long existed and has not hitherto been satisfactorily solved.

Problems of the control of the quality of the semiconductor-substrate interface also exist for substrate types other than glass and for semiconductor materials other than amorphous hydrogenated silicon. The invention relates to any local passivation of a random substrate.

EP-A-377 365 describes a local passivation of a substrate by a polymer deposited simultaneously with the erosion of metal oxide patterns using a particular mixture of three gases. This erosion/deposition method leads to thickness inhomogeneities and to a lack of uniformity of the mechanical and electrical characteristics in the polymer layer for substrate surfaces of $\geq 1$ dm. Thus, said method is not usable for producing large flat-faced display screens.

SUMMARY OF THE INVENTION

According to an essential feature of the invention, the local passivation process for a substrate comprises the following stages:

A) producing photosensitive resin patterns on the substrate outside the areas to be passivated, B) subjecting the structure obtained in A) to the action of a radio-frequency plasma essentially constituted by hydrocarbon and thus deposit an amorphous hydrogenated carbon layer on said structure and C) dissolving the resin patterns in order to eliminate the amorphous carbon deposited on the resin, the amorphous carbon deposited on said areas constituting the said passivation.

The invention makes use of a lift-off method, whose principle is known in connection with thin films and microelectronics. Reference is made in this connection to:

Handbook of thin film technology by Leon I. Maissel and Reinhard Glang, McGraw-Hill Book Company, chapter 7, pp 48–49. "Special pattern-formation techniques".

The use of this method, unlike the prior art, makes it possible to obtain an amorphous hydrogenated carbon passivation layer or film having a thickness and mechanical and electrical characteristics which are constant over a large surface ($>1$ dm$^2$). Thus, the invention is perfectly suitable for producing large flat-faced screens. The inventive process makes it possible to obtain an amorphous hydrogenated carbon layer with a resistivity between $10^{12}$ and $10^{14}$ ohms/cm, which ensures a good electrical insulation. In particular, this local amorphous hydrogenated carbon deposit can be interposed between the sources and drains of thin film transistors having the "stacked with gate on top" configuration. This passivation process is particularly well suited to producing a thin film transistor with the "stacked with gate on top" configuration.

The invention therefore relates to a process for the production of a thin film transistor comprising:
a) depositing on an electrically insulating substrate a layer of a first conductive material,
b) producing photosensitive resin patterns on the layer of the first conductive material defining the patterns to be etched in said layer,
c) eliminating the areas of the first conductive material layer not covered with resin,
d) depositing an amorphous hydrogenated carbon layer on the structure obtained in c),
e) dissolving the resin patterns in order to eliminate the amorphous carbon deposited on the resin,
f) depositing a layer of a semiconductor on the structure obtained in e),
g) depositing a layer of a first electrical insulant on the semiconductor layer,
h) depositing a layer of a second conductive material on the layer of the first insulant,
i) photoengraving the stack of layers of the second conductive material, the first electrical insulant and the semiconductor in order to fix the dimensions of the transistor and
j) passivating the structure obtained in i) with a second electrical insulant.

Therefore the process according to the invention can be used for the production of flat-faced screens having an active matrix according to the two masking level method and as a result of the a-C:H deposition procedure used, there is no supplementary masking stage.

In a gate on top structure, the layer of the first conductive material is etched in order to form the transistor source and drain, whilst the layer of the second conductive material is etched to form the transistor gate. In a gate on the bottom structure, the layer of the first conductive material is etched to form the gate of the transistor, whereas the layer of the second conductive material is etched to form the transistor source and drain.

As a function of the chosen structure and the illumination method selected, the first and second conductive materials can be transparent or reflecting.

Advantageously, the second electrical insulant is amorphous hydrogenated carbon.

As described hereinbefore, a-C:H layers are obtained from a radio-frequency plasma essentially constituted by hydrocarbon. The term hydrocarbon is understood to mean organic compounds essentially constituted by carbon and hydrogen.

The hydrocarbons usable in the invention are those from the group of alkanes, alkenes and alkynes provided by all gas producers for the microelectronics industry. In particular, they are hydrocarbons having 1 to 6 carbon atoms and can be saturated, unsaturated or aromatic.

Hydrocarbons usable in the invention are acetylene, propane diene, ethylene, butene, propylene, methane, ethane, butane and propane. Preference is given to the use of methane.

According to the invention, it is possible to use a hydrocarbon or a mixture of hydrocarbons.

The amorphous hydrogenated carbon deposits according to the invention have the advantage of being produced at ambient temperature, which makes it unnecessary to excessively raise the temperature of the resin used for the lift-off, so that there is no deterioration thereof.

In order to obtain a planar transistor structure, the thickness of the amorphous hydrogenated carbon layer deposited during stage d) is equal to that of the layer of the first conductive material. This is of particular interest when the first conductive material layer is used for producing the source and drain contacts of the transistor.

By adjusting the self-bias conditions of the substrate, as well as the pressure and gas flow rate, the inventors have demonstrated that it was possible to vary the hydrocarbon dissociation rate and particularly that of methane in the plasma. As a function of the hydrocarbon dissociation rate, the polymer films obtained are more or less hydrogenated, which gives them very different physical properties, particularly with regards to their resistivity. It is therefore possible to modify the properties of the deposited carbon layer as a function of the envisaged application.

BRIEF DESCRIPTION OF THE DRAWINGS

Other features and advantages of the invention can be gathered from the following illustrative and non-limitative description. This description relates to the production of a gate on top thin film transistor, but obviously the invention has a more general application, as has been shown hereinbefore. The description relates to the following drawings, wherein show.

DETAILED DESCRIPTION

Figure 1A:
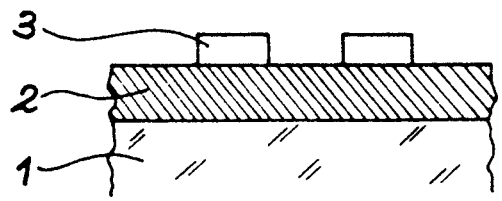
FIGS. 1a to 1f Diagrammatically the different stages of producing a thin film transistor according to the invention.

The deposition of amorphous hydrogenated carbon films according to the invention takes place with the aid of a RIE reactor conventionally used in microelectronics. The substrate for receiving the deposit is consequently placed on an electrode connected to a radio-frequency generator, so that the deposit is of the ionic type. In general, use is made of a frequency of 13.56 MHz.

In all the experimental tests carried out, pure methane was used for creating the plasma. In addition, the deposits were made at ambient temperature.

Different experimental conditions were studied for the deposition of the thin amorphous hydrogenated carbon films and are as follows:
methane pressure: 1.33 to 20 Pa (10 to 150 mTorrs)
methane flow rate: 5 to 50 cm$^3$/min
self-bias of substrate: 10 to 300 V
RF power: 10 to 280 W.

Under these conditions, the films obtained make it possible to carry out the passivation functions of a substrate and the "planarization" of transistors according to the invention.

More specifically, the carbon films obtained have the following characteristics:
1) thickness $\leq$ 200 nm
2) high resistivity
3) perfect surface state 4) low mechanical stress 5) homogeneous properties on large surfaces (>1 dm²).

1) Thickness

With a view to bringing about a simple passivation of a glass substrate, a few nm polymer deposit is sufficient.

However, to carry out a perfect "planarization" of the transistor, particularly between the source and drain, it is necessary to deposit a 200 nm thick film corresponding to the thickness of the conductive layer used for the source and drain. These two types of deposit were successfully obtained at deposition speeds between 1.5 and 20 nm/minute.

2) Resistivity

In order to avoid any short-circuit risks, particularly between the transistor source and drain (or between the gates of an array of transistors with the gate on the bottom), the deposited polymer must have a high resistivity. The amorphous hydrogenated carbon films produced all have a resistivity between $10^{12}$ and $10^{14}$ ohms.cm. The inventors have demonstrated that these values are sufficiently high to avoid any short-circuit risk between the source and drain (or gates).

3) Stress

The films must naturally have a good adhesion to the generally glass substrate, but also must be subject to low stress in order to avoid a "flaking off" on the surface of the resin and a separation of the stack of layers forming the transistor.

The measurements carried out (sag of a thin substrate) demonstrate that the films are compressively stressed to values comparable to those conventionally measured for other materials deposited in thin film form. The lowest stress values for a given a-C:H film thickness are obtained for the lowest RF power levels and for the highest gas pressures, as can be clearly gathered from the following table I.

Table I relates to 90 nm films deposited with pure CH₄ at a flow rate of 20 cm³/min. The stress values are given in $10^9$ Pa (i.e. $10^{10}$ dyne/cm²).

TABLE I

| Pressure/power | | 10 W | 50 W | 200 W |
|---|---|---|---|---|
| 1.33 Pa | (10 mT) | — | 34 | — |
| 7.7 Pa | (58 mT) | — | 13 | — |
| 13.3 Pa | (100 mT) | <9 | 9 | 20 |

The following table II gives the thickness limits for a-C:H films prior to their separation from a glass substrate. These films are deposited with pure CH₄ at a flow rate of 20 cm³/min and a pressure of 13.3 Pa (100 mT).

TABLE II

| Thickness limit (nm) | 420 | 320 | 170 | 130 | 100 |
|---|---|---|---|---|---|
| Power (W) | 20 | 50 | 200 | 400 | 600 |

It can be seen that the thickness limit of the films decreases when the RF power increases, everything else being equal. In addition, the thickness limits of the films are always below 100 nm for pressures of 2.66 to 4 Pa (20 to 30 mT).

The optimum a-C:H deposition conditions for a low stress and high resistivity are as follows:
  pressure: 6.6 to 20 Pa (50 to 150 mT) and typically 13.3 Pa (100 mT),
  methane flow rate: 10 to 50 cm³/min and typically 20 cm³/min,
  RF power: 10 to 100 W and typically 50 W,
  self-bias: 10 to 300 V and typically 10 to 55 V.

4) Surface state

In the reactor used, the substrate is kept at ambient temperature in order to obtain the deposition of perfectly amorphous films (the amorphous state of the films having been determined by X-ray diffraction). A topographical analysis of the surface of the films under a scanning electron microscope up to magnifications of 30,000 reveal no intrinsic surface defect in the deposited material.

The quality of the interface between the amorphous hydrogenated carbon and the films forming the transistor can consequently not undergo any deterioration for roughness reasons.

5) Large surface

The homogeneity of the properties of the deposited films was checked on square substrates having a side length of 20 cm. The substrates on which the local deposition of amorphous hydrogenated carbon takes place can be of glass, quartz, silica, silicon or plastics. Moreover, the passivation of these substrates makes it possible to use mediocre quality glass substrates, e.g. of the soda-lime glass type and therefore having a low cost, thereby reducing the cost of manufacture of flat-faced screens.

With reference to FIGS. 1a to 1f a description will now be given of the main production stages of a thin film transistor with the gate on top according to the invention.

The first production stage for said transistor comprises, as shown in FIG. 1a, the deposition on a glass substrate 1 of a 25 to 225 nm thick transparent metal oxide film or layer 2. The latter is of indium-tin oxide (ITO) deposited by vacuum magnetron sputtering.

On said ITO film is formed a first photosensitive resin mask 3 defining the location of the source and drain of the transistor to be produced according to conventional photolithography processes.

Figure 1B:
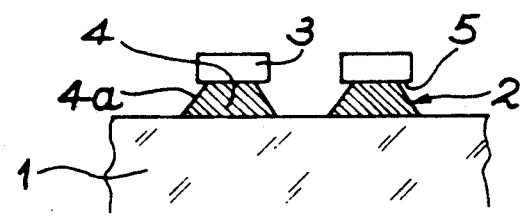

As shown in FIG. 1b, this is followed by the etching of the metal oxide film 2 by spray or in a hydrochloric acid bath. The etching process is checked with regards to the etching agent concentration, the temperature and the etching time, so as to obtain ITO patterns 4 having inclined flanks 4a. In particular, said etching is carried out in a bath containing 37% hydrochloric acid diluted to 50% in water and heated to a temperature of approximately 55° C. The inclined flanks 4a of the patterns 4 make it possible to free a resin border 5 at the ITO-resin interface. The patterns 4 obtained constitute the transistor source and drain.

Figure 1C:
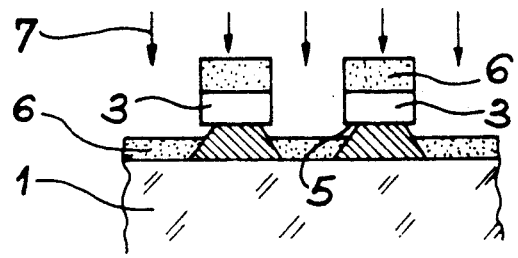

As shown in FIG. 1c, this is followed by an isotropic deposition at ambient temperature of an amorphous hydrogenated carbon film or layer 6 on the complete structure. This film 6 has a thickness of 10 to 150 nm. It is formed under the optimum conditions described hereinbefore using a radio-frequency CH₄ plasma.

The isotropy of the deposit leads to the formation of a discontinuous carbon film 6. Thus, a visible border 5 is retained below the resin patterns 3.

The lift-off of the carbon film takes place without difficulty by dissolving the resin 3, from the border 5 and using acetone or a solvent conventionally used in microelectronics and known as "posistrip".

Figure 1D:
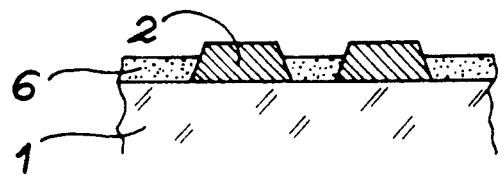

Only the carbon 6 deposited on the glass 1 is retained, as shown in FIG. 1d. This gives a local passivation of the glass substrate 1, which serves as a barrier to the diffusion of the impurities contained in the glass towards the semiconductor film of the transistor, which will now be deposited. These impurities more particularly result from ITO etching.

Figure 1E:
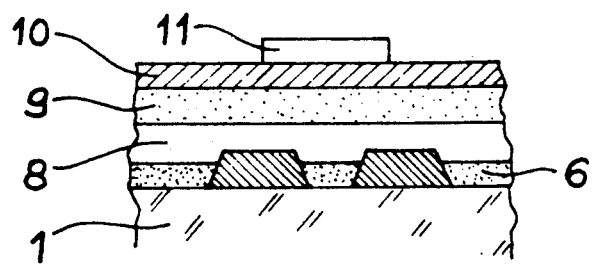

The manufacture of the transistor continues, as shown in FIG. 1e, by the deposition on the complete structure of an amorphous hydrogenated silicon film 8, a silicon nitride film 9 and then an aluminium silicide or alminium film 10.

Films 8 and 9 are deposited by plasma assisted chemical vapour deposition and the metal film by sputtering or evaporation. These films 8, 9 and 10 have respective thicknesses of 20, 300 and 200 nm.

This is followed by the definition of the dimensions of the transistor using a second resin photomask 11 produced by known photolithographic processes.

This is followed by a wet route etching of the film 10 and then a dry route anisotropic etching of the films 9 and 8. The etching agents are respectively a $SF_6$ plasma for films 8 and 9 and an orthophosphoric acid bath for film 10.

Figure 1F:
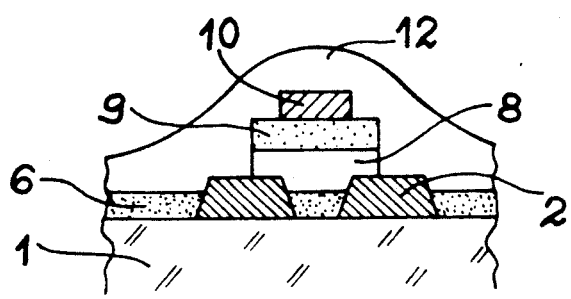

Following the wet route elimination of the resin photomask 11, it is optionally possible to form another, not shown photomask, defining the dimensions of the transistor gate in the film 10. With the aid of said photomask, there is a further wet etching of the conductive film 10 to form the transistor gate. Following the elimination of this photomask, the complete structure is passivated by depositing a new amorphous hydrogenated carbon film or silicon nitride film 12. The structure obtained is shown in FIG. 1f.

The carbon film 12 is deposited using a $CH_4$ RF plasma and the silicon nitride film by plasma assisted chemical vapour deposition.

It can be seen that this process of passivating the substrate and "planarizing" the transistor source and drain requires no supplementary masking level compared with known transistor production processes.

The process described relative to FIGS. 1a to 1f is compatible with the process for the production of an active matrix display screen described in FR-A-2 571 893.

The process of depositing a thin amorphous hydrogenated carbon film and its lift-off was applied to the production of field effect transistors for the control of flat-faced liquid crystal screens.

Different passivation and planarization tests were performed as a function of the hydrogen quantity contained in the carbon films. The hydrogen concentration contained in the films is not known in absolute value terms, but can be modified in a simple manner by adjusting the methane dissociation rate by checking the self-bias of the substrate.

In particular, the inventors have demonstrated by measuring the resistivity, optical absorption and SIMS analysis, that carbon films deposited with the lowest self-bias values contain the most hydrogen.

The following table III clearly shows the effectiveness of the passivation of the glass substrate, as well as the influence of the quality of the passivation film on the electrical characteristics of the transistors.

The carbon deposits were made under a pressure of 13.3 Pa (100 mTorr) and for a $CH_4$ flow rate of 20 $cm^3$/min. The RF power was 50 W. The drain voltage was 0.1 V and the gate voltage 8 V.

The table more particularly shows the evolution of the ratio of the drain currents in the conductive state ($I_{on}$) and the blocked state ($I_{off}$) as a function of the nature of the passivation films deposited at different self-bias voltages.

This table shows that the ratio of the currents $I_{on}/I_{off}$ increases rapidly with the hydrogen concentration in the passivation films. The ratio of these currents is 25 times greater in the case of a transistor obtained with passivation deposited with a self-bias of 10 V compared with a transistor produced directly on the glass substrate.

The Expert knows that the main properties required by the control transistor of each image element of a flat screen are, in the addressing phase, a current $I_{on}$ between the source and drain which must be as high as possible, so as to charge the liquid crystal capacitor as rapidly as possible at the video voltage and, in the information maintaining phase, a current $I_{off}$ which is as low as possible, so that the capacitor remains charged between two successive addressing operations.

The $I_{on}/I_{off}$ ratio must be at least equal to $10^5$ in order to bring about the operation of a flat-faced screen having a few hundred lines. This objective is achieved for locally passivated amorphous hydrogenated carbon films deposited at self-bias voltages below 55 V.

Figure 2:
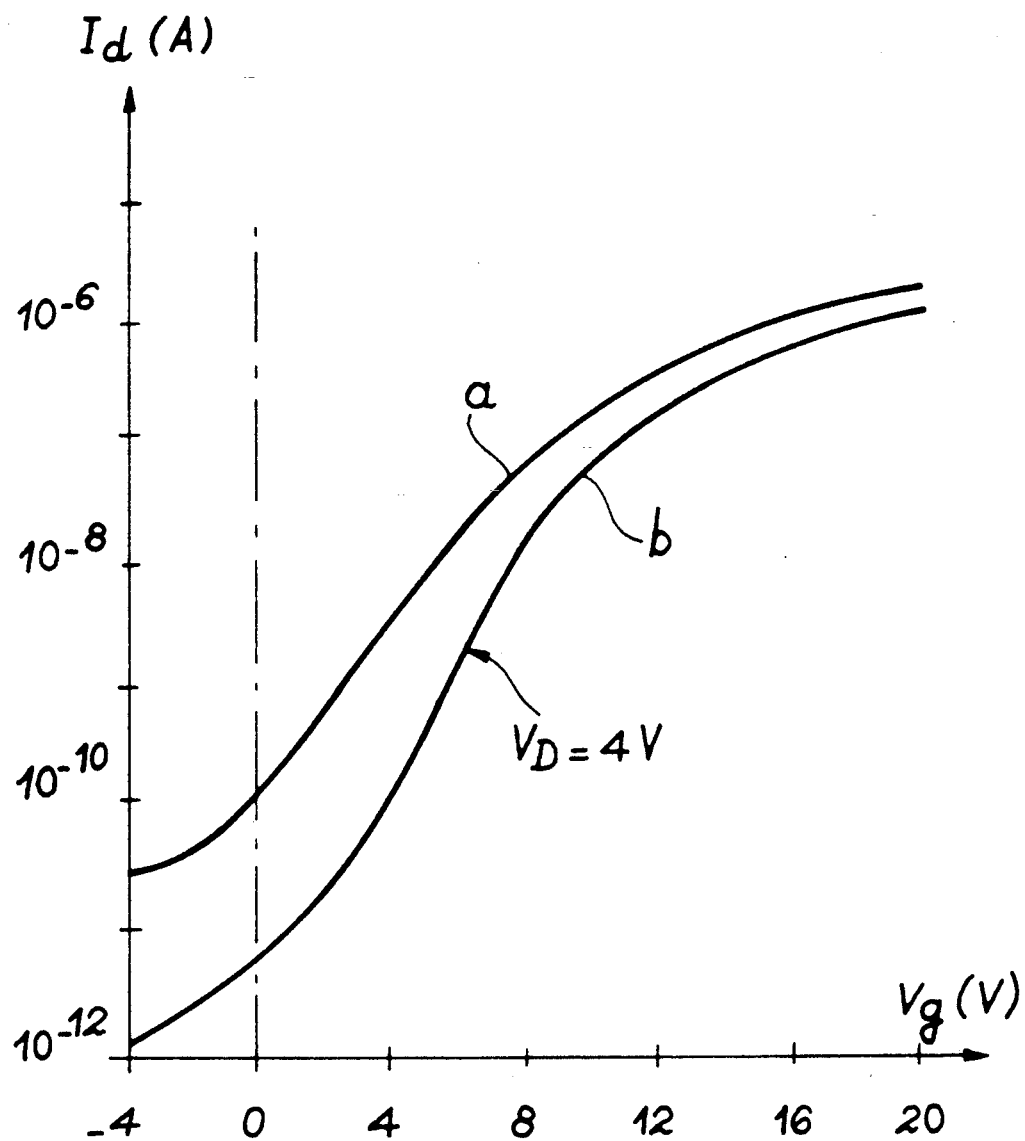
FIG. 2 Variations of the drain current Id, in amperes, as a function of the gate voltage Vg, in volts, for a non-passivated control transistor (curve a) and for a passivated transistor according to the invention (curve b).

FIG. 2 gives the transfer characteristics $Id = f(Vg)$ for a non-passivated control transistor (curve a) and for a transistor (curve b) passivated between the source and drain by an amorphous hydrogenated carbon film, deposited with a self-bias of 40 V under the aforementioned optimum conditions. Id is the drain current in amperes and Vg the voltage in volts applied to the transistor gate. These curves are obtained for a drain voltage of 4 V, a channel width of 10 μm and a channel length of 40 μm.

Apart from the advantages described hereinbefore, the amorphous hydrogenated carbon deposited between the transistor source and drain serves as an optical mask, thus limiting the prejudicial effects of the ambient observation light of the screen on the amorphous hydrogenated silicon.

FIGS. 1c to 1f show an amorphous hydrogenated carbon film 6 with a thickness slightly below that of the patterns 4 of the transistor source and drain. As stated hereinbefore, it is still possible to deposit a film 6 with a thickness strictly equal to that of the source and drain patterns 4, in order to obtain a perfectly planar structure prior to the deposition of the semiconducting film 8.

TABLE III

| Self-bias | $I_{on}$ (μA) | $I_{off}$ (pA) | $\frac{I_{on}}{I_{off}}$ | Hydrogen concentration |
|---|---|---|---|---|
| 10 | 1.6 | 1.6 | $10^6$ | ↑ |
| 55 | 2.6 | 12 | $2 \cdot 10^5$ | |
| 90 | 3.4 | 39 | $9 \cdot 10^4$ | Increasing |
| 160 | 3.1 | 39 | $8 \cdot 10^4$ | |
| 290 | 3.7 | 79 | $5 \cdot 10^4$ | |
| Control | 2.6 | 73 | $4 \cdot 10^4$ | |

I claim:

1. Process for the production of a thin film transistor comprising:
   a) depositing on an electrically insulating substrate (1) a layer (2) of a first conductive material,
   b) producing photosensitive resin patterns (3) on the layer of the first conductive material defining the patterns to be etched in said layer,
   c) eliminating the areas of the first conductive material layer not covered with resin, d) depositing an amorphous hydrogenated carbon layer (6) on the structure obtained in c), e) dissolving the resin patterns in order to eliminate the amorphous carbon deposited on the resin, f) depositing a layer (8) of a semiconductor on the structure obtained in e), g) depositing a layer (9) of a first electrical insulant on the semiconductor layer, h) depositing a layer (10) of a second conductive material on the layer of the first insulant, i) photoengraving the stack of layers of the second conductive material, the first electrical insulant and the semiconductor in order to fix the dimensions of the transistor and j) passivating the structure obtained in i) with a second electrical insulant (12).

2. Process according to claim 1, characterized in that the second electrical insulant (12) is of amorphous hydrogenated carbon.

3. Process according to claim 1, characterized in that the amorphous carbon film (6) deposited in (d) has a thickness equal to that of the first conductive material film.

4. Process according to claim 1, characterized in that the amorphous hydrogenated carbon is deposited from a radio-frequency plasma essentially constituted by hydrocarbon.

5. Process according to claim 4, characterized in that the plasma is a pure methane plasma.

6. Process according to claim 1, characterized in that the amorphous hydrogenated carbon is deposited at ambient temperature.

7. Process according to claim 1, characterized in that use is made of a substrate self-bias voltage below 55 V.

8. Process according to claim 1, characterized in that the substrate (1) is of glass.

9. Process according to claim 1, characterized in that the semiconductor (8) is of amorphous hydrogenated silicon.

10. Process according to claim 1, characterized in that the deposited amorphous carbon has a resistivity between $10^{12}$ and $10^{14}$ ohms.cm.

11. Process according to claim 1, characterized in that the amorphous hydrogenated carbon is deposited using a hydrocarbon pressure of 6.6 to 20 Pa.

* * * * *